United States Patent
Kobayashi

(10) Patent No.: US 7,754,535 B2
(45) Date of Patent: Jul. 13, 2010

(54) METHOD OF MANUFACTURING CHIP INTEGRATED SUBSTRATE

(75) Inventor: Toshio Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/123,673

(22) Filed: May 20, 2008

(65) Prior Publication Data

US 2008/0293236 A1 Nov. 27, 2008

(30) Foreign Application Priority Data

May 21, 2007 (JP) ............................ 2007-133948

(51) Int. Cl.
*H01L 23/488* (2006.01)
(52) U.S. Cl. ............................... 438/119; 257/E21.514
(58) Field of Classification Search ................ 438/612, 438/617, 106, 118, 119; 257/E21.476, E21.514, 257/737, 772, 780, E21.499
See application file for complete search history.

(56) References Cited

U.S. PATENT DOCUMENTS 6,406,988 B1 * 6/2002 Chung ...................... 438/612
6,979,895 B2 * 12/2005 Akram et al. ............... 257/686
2003/0155652 A1 * 8/2003 Murata et al. ............... 257/738
2003/0222336 A1 * 12/2003 Wu ............................ 257/678
2004/0195682 A1 * 10/2004 Kimura ...................... 257/723
2007/0063347 A1 * 3/2007 Su ............................. 257/741

FOREIGN PATENT DOCUMENTS

JP 2003-347722 12/2003

* cited by examiner

*Primary Examiner*—Matthew S. Smith
*Assistant Examiner*—Michele Fan
(74) *Attorney, Agent, or Firm*—Drinker Biddle & Reath LLP

(57) ABSTRACT

There are provided the steps of connecting a chip component 13 to a first substrate 10 through wire bonding, providing, on a second substrate 20, an electrode 21 having a solder coat 23 with a copper core 22, polishing a portion of the electrode 21 which is to be bonded to the connecting pad 12, thereby exposing the copper core 22 from the solder coat 23, bonding the exposed portion of the copper core 22 to the bump connecting pad 12 by using a flux non-containing conductive paste 30, thereby bonding the substrates 10 and 20 to each other, and filling a sealing resin 40 in a clearance portion between the substrates 10 and 20.

11 Claims, 4 Drawing Sheets

METHOD OF MANUFACTURING CHIP INTEGRATED SUBSTRATE

BACKGROUND OF THE INVENTION

The present invention relates to a method of manufacturing a chip integrated substrate and more particularly to a method of manufacturing a chip integrated substrate which manufactures a chip integrated substrate having a chip provided between a pair of substrates.

At present, a performance of an electronic device using a semiconductor device including a semiconductor chip has been enhanced, and it has been demanded to increase a density in the case in which a semiconductor chip is mounted on a substrate and to reduce a size and a space of the substrate mounting the semiconductor chip thereon.

Therefore, there has been proposed a substrate having a semiconductor chip embedded therein, that is, a so-called chip integrated type wiring board (hereinafter referred to as a chip integrated substrate), and there have been proposed various structures for causing the semiconductor chip to include the substrate.

An example of the chip integrated substrate is disclosed in Patent Document 1, for example. The chip integrated substrate disclosed in the Patent Document 1 is provided with a bump for functioning as a spacer between a first mounting substrate and a second mounting substrate, and has a structure in which a chip component is mounted between a pair of substrates which are separated from each other through a bump. Moreover, there is employed a structure in which a sealing resin is provided between a pair of mounting substrates to protect the chip.

As a method of manufacturing the chip integrated substrate disclosed in the Patent Document 1, moreover, the chip is first flip-flop mounted on the first mounting substrate and a bump functioning as a spacer is subsequently soldered to the first mounting substrate. Next, at least a portion in the vicinity of an apex of the bump is exposed onto the first mounting substrate and a sealing resin is formed to seal a chip component.

When the sealing resin is formed, the second mounting substrate is laminated thereon to be electrically connected to the bump. Each of the processings is executed to manufacture the chip integrated substrate disclosed in the Patent Document 1.

[Patent Document 1] JP-A-2003-347722

The chip integrated substrate disclosed in the Patent Document 1 uses a method of flip-chip mounting a chip component on the first mounting substrate. In case of a chip component having a comparatively small number of terminals, however, the use of a wire bonding method can reduce a cost and can enhance an assembling property more greatly than that of a flip-chip mounting method.

On the other hand, in the method of manufacturing the chip integrated substrate disclosed in the Patent Document 1, the bump is provided on the first mounting substrate after the chip is mounted, and a soldering treatment is carried out at that time. In this case, a solder flux is applied to a soldering position of the bump of the first mounting substrate in a normal soldering treatment to enhance a wettability, thereby improving a reliability of a soldering bond, which is not particularly described in the Patent Document 1.

In the case in which the solder flux remains as a residue after soldering, it causes a corrosion. For this reason, a cleaning treatment is carried out. In the cleaning treatment, the flux is reliably removed. Therefore, a cleaning solution is injected into a solder bonding position at a comparatively high flow velocity.

In the chip integrated substrate, however, a reduction in a size and space saving are implemented as described above, and the chip is mounted in the vicinity of a position in which the bump is provided in some cases. In these cases, when the chip component is connected to the first mounting substrate by using the wire bonding method, there is a possibility that the cleaning solution might be injected onto a wire. In this case, there is a problem in that the wire is broken or the wire is deformed, resulting in the generation of a short circuit between adjacent wires.

SUMMARY OF THE INVENTION

In consideration of the respects, it is an object of the invention to provide a method of manufacturing a chip integrated substrate which can maintain a high reliability even if a chip component is connected to a first substrate through a wire.

In order to solve the problems, according to a first aspect of the invention, there is provided a method of manufacturing a chip integrated substrate, including the steps of:

connecting a chip component to a first substrate having a connecting pad formed thereon through wire bonding;

providing, on a second substrate, an electrode having a metal core coated with a solder film;

polishing a portion of the electrode which is to be bonded to the connecting pad to remove the solder film to expose the metal core;

bonding the connecting pad to the portion of the electrode from which the metal core is exposed by using a flux non-containing conductive bonding member, and bonding the first substrate to the second substrate in such a manner that the chip component is provided therein; and filling a resin in a clearance portion between the first substrate and the second substrate.

Moreover, according to a second aspect of the invention, there is provided the method of manufacturing a chip integrated substrate according to the first aspect, wherein the conductive bonding member is a flux non-containing conductive paste.

Furthermore, according to a third aspect of the invention, there is provided the method of manufacturing a chip integrated substrate according to the first or second aspect, wherein a material of the metal core is copper.

In addition, according to a forth aspect of the invention, there is provided the method of manufacturing a chip integrated substrate according to the second aspect, wherein the conductive paste uses copper or silver as a filler.

Further, according to a fifth aspect of the invention, there is provided a method of manufacturing a chip integrated substrate, including the steps of:

connecting a chip component to a first substrate having a connecting pad formed thereon through wire bonding;

providing, on a second substrate, an electrode formed by a metallic material and protruded from a substrate surface;

bonding the connecting pad to the electrode by using a flux non-containing conductive bonding member, and bonding the first substrate to the second substrate in such a manner that the chip component is provided therein; and filling a resin in a clearance portion between the first substrate and the second substrate.

Furthermore, according to a sixth aspect of the invention, there is provided the method of manufacturing a chip integrated substrate according to the fifth aspect, wherein the conductive bonding member is a flux non-containing conductive paste.

In addition, according to a seventh aspect of the invention, there is provided the method of manufacturing a chip integrated substrate according to the fifth or sixth aspect, wherein
the metallic material is copper.

Moreover, according to an eighth aspect of the invention, there is provided the method of manufacturing a chip integrated substrate according to the sixth aspect, wherein
the conductive paste uses copper or silver as a filler.

According to the invention, the portion of the electrode in which the metal core is exposed from the solder film or the electrode formed by a metallic material and the connecting pad are bonded to each other by using the flux non-containing conductive bonding member. Consequently, a step of cleaning the flux can be made unnecessary. Consequently, it is possible to simplify the process for manufacturing the chip integrated substrate. Moreover, the flux cleaning treatment is not executed. Even if the chip component is connected to the first substrate through the wire bonding, therefore, it is possible to prevent a breakage or a short circuit in the wire from being generated in the flux cleaning, thereby enhancing a reliability of the chip integrated substrate.

DETAILED DESCRIPTION OF THE PREFERRED EMBODIMENTS

Figure 1A:
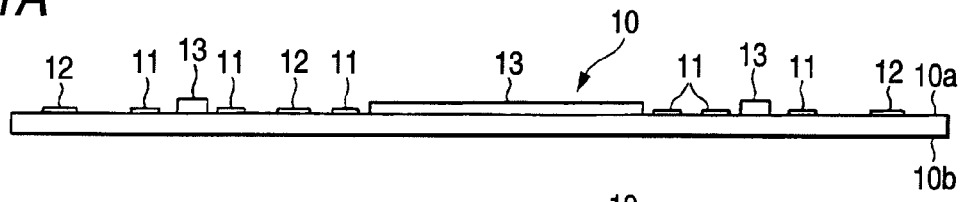
FIGS. 1A to 1F are views for explaining a method of manufacturing a chip integrated substrate according to a first example of the invention in accordance with a manufacturing procedure (No. 1)

Next, the best mode for carrying out the invention will be described with reference to the drawings.

FIGS. 1 and 2 are views for explaining a method of manufacturing a chip integrated substrate according to a first example of the invention in accordance with a manufacturing procedure. In particular, FIG. 2B shows a chip integrated substrate 1A which is manufactured by the manufacturing method according to the example, and a structure of the chip integrated substrate 1A will be described with reference to FIG. 2B prior to explanation of the method of manufacturing a chip integrated substrate for convenience of the description.

The chip integrated substrate 1A is roughly constituted by a first substrate 10, a second substrate 20, a chip component 13, an electrode 21 and a sealing resin 40. The first substrate 10 is a wiring board on which a wiring pattern is formed, and has a plurality of chip-shaped electronic components 13 (hereinafter referred to as chip components) mounted on an upper surface 10a. In the example, the chip component 13 is connected to a wire connecting pad 11 formed on the first substrate 10 through a wire 14 used for wire bonding through an Au wire.

Moreover, the second substrate 20 is also a wiring board on which a wiring pattern is formed, and has the electrode 21 connected to the wiring pattern. The electrode 21 is bonded to a bump connecting pad 12 formed on the first substrate 10 through a flux non-containing conductive paste 30 as will be described below in detail. The electrode 21 functions as a spacer for electrically connecting the first substrate 10 to the second substrate 20 and separating the first substrate 10 from the second substrate 20 by a predetermined distance. Moreover, a height of the electrode 21 is set to be slightly greater than that of a wire loop of each wire 14.

Moreover, the sealing resin 40 is filled between the first substrate 10 and the second substrate 20. Consequently, each chip component 13 is sealed with the sealing resin 40 and is thus protected. Moreover, the sealing resin 40 also functions as an adhesive. Therefore, the first substrate 10 and the second substrate 20 are firmly bonded to each other with the sealing resin 40.

According to the chip integrated substrate 1A having the structure, the chip component 13 is provided between a pair of substrates 10 and 20. Moreover, a clearance between the first substrate 10 and the second substrate 20 can be set to be a distance at which the second substrate 20 is prevented from coming in contact with the wire 14 through the electrode 21 with high precision. Therefore, it is possible to reduce a size of the chip integrated substrate 1A.

In addition, the chip component 13 is sealed with the sealing resin 40 provided between the substrates 10 and 20, and the substrates 10 and 20 are firmly bonded to each other through the sealing resin 40. Therefore, the chip integrated substrate 1A can be caused to have a high reliability.

Next, description will be given to a method of manufacturing the chip integrated substrate 1A having the structure.

In order to manufacture the chip integrated substrate 1A, first of all, the first substrate 10 is prepared. The first substrate 10 has a multilayer wiring structure in which a through hole, a bottomed via plug, a wiring pattern and a solder resist (which are not shown) are provided on a core substrate formed by an ordinary printed circuit board and a prepreg material (a material obtained by impregnating a glass fiber with an epoxy resin), for example. The wire connecting pad 11 and the bump connecting pad 12 which are connected to the wiring patterns are formed on the upper surface 10a of the first substrate 10.

The chip component 13 is mounted on the upper surface 10a of the first substrate 10 having the structure. FIG. 1A shows a state in which the chip component 13 is mounted on the first substrate 10. The chip component 13 is a semiconductor chip, for instance, and is mounted in face-up in the example.

The chip component 13 mounted on the first substrate 10 is not restricted to the semiconductor chip but may be another electronic component (for example, a capacitor, a resistor or an inductor).

Moreover, the wire connecting pad 11 and the bump connecting pad 12 actually have such a structure as to be exposed from an opening portion formed on a solder resist disposed on the surface of the first substrate 10. In FIGS. 1 and 2, they are shown to be protruded from the upper surface 10a for easy understanding.

Figure 1B:
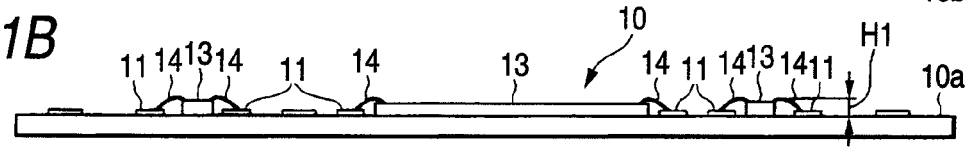

When the chip component 13 is mounted on the first substrate 10 as described above, a step of electrically connecting the chip component 13 to the first substrate 10 (a wire bonding step) is subsequently carried out. As described above, in the example, the chip component 13 is mounted on the first substrate 10 in face-up, and the chip component 13 and the wire connecting pad 11 are connected by using a wire bonding method. More specifically, the first substrate 10 is attached to a wire bonding device, and the wire 14 is provided between the electrode formed on the chip component 13 and the wire connecting pad 11. FIG. 1B shows a state in which the wire 14 is provided between the chip component 13 and the wire connecting pad 11.

Figure 1C:
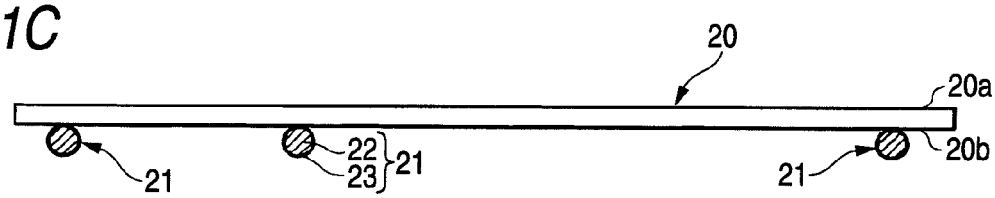

FIG. 1C shows the second substrate 20. The second substrate 20 has the same structure as the first substrate 10. More specifically, the second substrate 20 has a multilayer wiring structure in which a through hole, a bottomed via plug, a wiring pattern and a solder resist (which are not shown) are provided on a core substrate formed by an ordinary printed circuit board and a prepreg material, for example. A lower surface 20b (an opposed surface to the first substrate 10) of the second substrate 20 is set in a state in which an electrode connecting pad (not shown) connected to a wiring pattern is exposed from an opening formed on a solder resist.

The electrode 21 is bonded to the electrode connecting pad of the second substrate 20 having the structure. FIG. 1C shows a state in which the electrode 21 is bonded to the second substrate 20.

The electrode 21 has such structure that a solder coat 23 is formed (covered) on a metal core 22. In the example, a ball formed of copper is used for the metal core 22 (the metal core 22 will be hereinafter referred to as a copper core 22).

In order to bond the electrode 21 to the second substrate 20, first of all, a solder flux is applied to the electrode connecting pad of the second substrate 20 and the electrode 21 is soldered to the electrode connecting pad. After the electrode 21 is bonded to the second substrate 20, moreover, a step of cleaning the flux is carried out. Since the flux cleaning is carried out in a state in which the second substrate 20 has not been bonded to the first substrate 10, the first substrate 10 is not influenced.

When the electrode 21 is bonded to the second substrate 20 as described above, a lower surface of the electrode 21 which is shown in the drawing, that is, a portion to be bonded to the bump connecting pad 12 is then polished. As a polishing method, for example, a buffing method can be used.

Figure 1D:
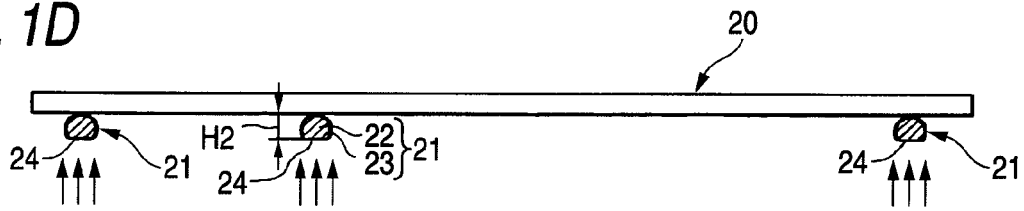

Thus, the portion of the electrode 21 which is to be bonded to the bump connecting pad 12 is polished. As shown in FIG. 1D, consequently, the solder coat 23 is removed so that a flat exposed surface 24 from which the copper core 22 is exposed is formed. In this case, moreover, an amount of protrusion of the electrode 21 obtained after the polishing from the lower surface 20b (which is shown in an arrow H2 of FIG. 1D) is set to be greater than a height of the wire loop of the wire 14 connected electrically to the wire connecting pad 11 (which is shown in an arrow H1 of FIG. 1B) (H2>H1).

It is possible to earlier execute either the step of mounting the chip component 13 on the first substrate 10 and carrying out the connection through the wire 14 as described with reference to FIGS. 1A and 1B or the step of bonding the electrode 21 to the second substrate 20 and polishing the electrode 21 as described with reference to FIGS. 1C and 1D or to execute both of them at the same time.

When the respective steps for the first substrate 10 and the second substrate 20 are ended, a step of bonding the first substrate 10 to the second substrate 20 is subsequently carried out.

In order to bond the first substrate 10 to the second substrate 20, first of all, the conductive bonding member 30 is provided on the bump connecting pad 12 formed on the first substrate 10. In the example, a conductive paste which does not contain a solder flux is used for the conductive bonding member 30 (the conductive bonding member 30 will be hereinafter referred to as a flux non-containing conductive paste 30). The flux non-containing conductive paste 30 has a structure in which a conductive particle such as copper or silver is mixed, as a filler, into a resin functioning as an adhesive.

Figure 1E:
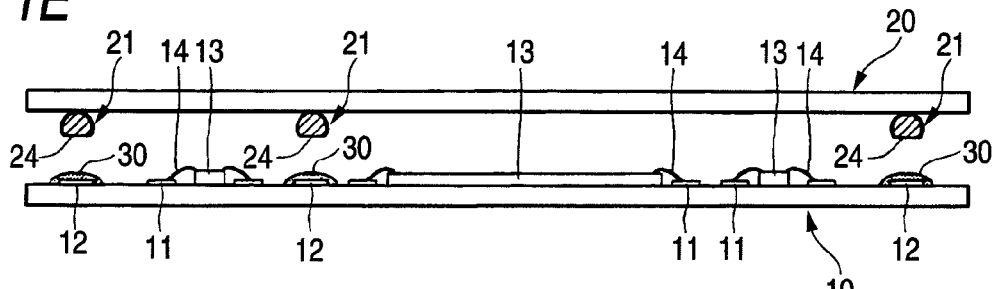

When the flux non-containing conductive paste 30 is provided on the bump connecting pad 12, the first substrate 10 and the second substrate 20 are subsequently positioned in such a manner that the electrode 21 and the bump connecting pad 12 are opposed to each other. FIG. 1E shows a state in which the second substrate 20 is positioned above the first substrate 10 on which the flux non-containing conductive paste 30 is provided.

Figure 1F:
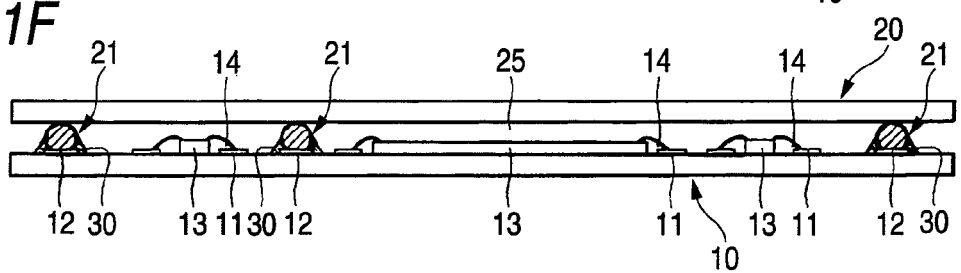

Next, the first substrate 10 and the second substrate 30 are pressure welded and heated if necessary. As shown in FIG. 1F, consequently, the electrode 21 and the bump connecting pad 12 are bonded to each other through the flux non-containing conductive paste 30 so that the electrode 21 and the bump connecting pad 12 are electrically connected to each other and are mechanically fixed.

In this case, generally, a bonding property of the solder to the conductive paste has a small bonding strength and a poor connecting reliability. In the example, however, the electrode 21 is polished so that a bonding position to the bump connecting pad 12 is the exposed surface 24 from which the copper core 22 is exposed as described with reference to FIG. 1D. In the example, therefore, the copper core 22 (the exposed surface 24) and the bump connecting pad 12 are bonded to each other through the flux non-containing conducive paste 30. Consequently, it is possible to implement a bond having a high reliability.

As in the example, furthermore, the bump connecting pad 12 and the electrode 21 are bonded to each other through the flux non-containing conductive paste 30. Consequently, the solder flux required for connecting the electrode to the pad through soldering as in the conventional art can be made unnecessary.

In the example, thus, the soldering is not used for bonding the electrode 21 to the bump connecting pad 12. For this reason, a flux required for the soldering is not used. In the example, therefore, the step of carrying out the flux cleaning which is conventionally required can be made unnecessary. Accordingly, it is possible to simplify the process for manufacturing the chip integrated substrate 1A. Moreover, the flux cleaning step is not executed. Even if the chip component 13 and the wire connecting pad 11 are connected to each other through the wire 14 in the first substrate 10, therefore, a breakage or a short circuit is not generated on the wire 14 so that the reliability of the chip integrated substrate 1A to be manufactured can be enhanced.

As described above, moreover, the height H2 of the electrode 21 from the lower surface 20b is set to be greater than the height H1 of the wire loop of the wire 14 from the upper surface 10a (H2>H1). When the first substrate 10 and the second substrate 20 are bonded to each other, therefore, the wire 14 can be prevented from being short-circuited due to a contact with the second substrate 20.

Figure 2A:
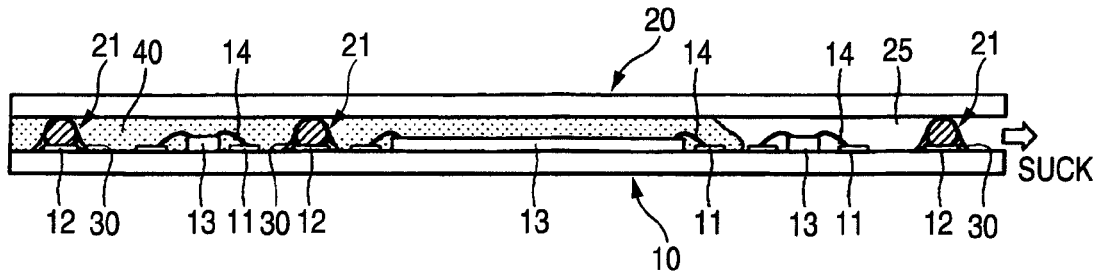
FIGS. 2A to 2D are views for explaining the method of manufacturing a chip integrated substrate according to the first example of the invention in accordance with the manufacturing procedure (No. 2)

When the first substrate 10 and the second substrate 20 are bonded to each other as described above, a step of filling the sealing resin 40 in a clearance portion (hereinafter referred to as a space portion 25) between the first substrate 10 and the second substrate 20 (a sealing step) is subsequently carried out as shown in FIG. 2A. At the step of filling the sealing step 40, a sucking treatment is carried out from one of sides of the space portion 25 (a right end in FIG. 2A in the example), and at the same time, the sealing resin 40 is filled from the other side. By filling the sealing resin 40 while carrying out the sucking treatment, thus, it is possible to reliably fill the sealing resin 40 in the space portion 25 even if the space portion 25 is narrow.

Figure 2B:
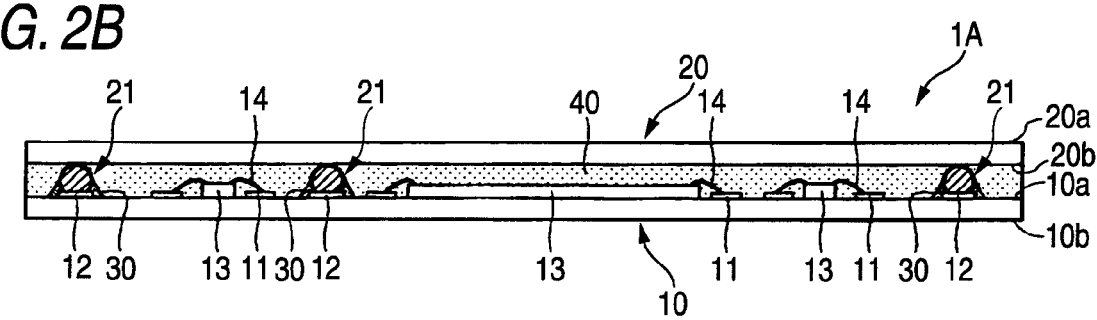
Figure 2C:
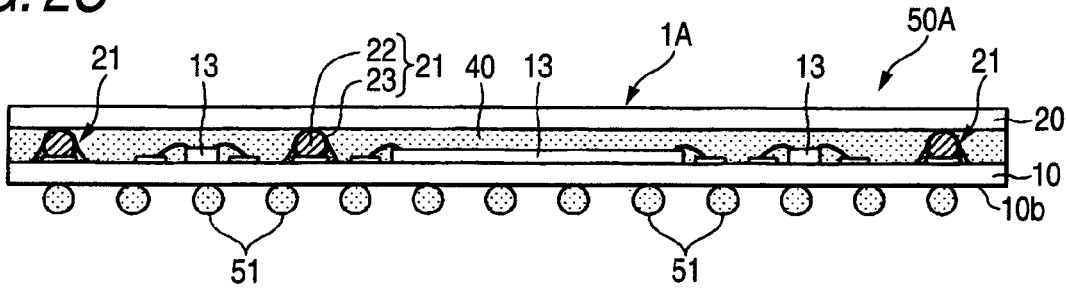
Figure 2D:
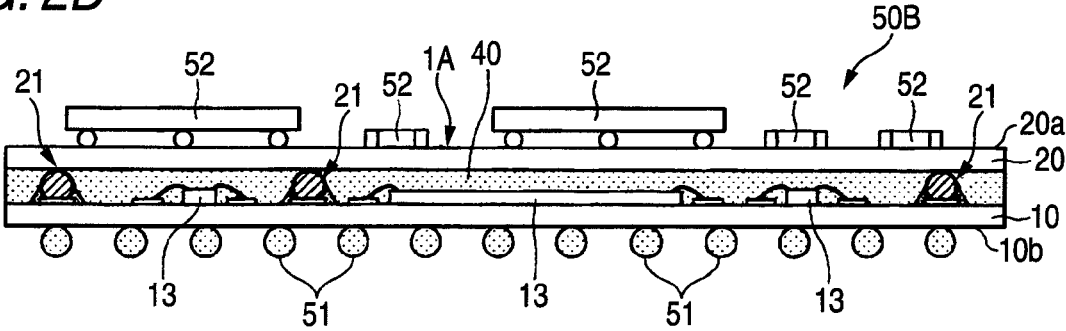

Subsequently, the step of curing the sealing resin 40 (for example, a heat treatment) is carried out to cure the sealing resin 40, and each of the steps described above is executed so that the chip integrated substrate 1A shown in FIG. 2B is manufactured.

The chip component 13 is mounted in the chip integrated substrate 1A which is manufactured as described above. If a solder ball 51 functioning as an external connecting terminal is disposed on a lower surface 10b of the first substrate 10, therefore, the chip integrated substrate 1A can be used as an electronic device 50A shown in FIG. 2C. In the structure shown in FIG. 2C, furthermore, an electronic component 52 is mounted on an upper surface 20a of the second substrate 20 so that an electronic device 50B having a higher density can be implemented.

Next, description will be given to a method of manufacturing a chip integrated substrate according to a second example of the invention.

FIGS. 3 and 4 are views showing a method of manufacturing a chip integrated substrate 1B according to the second example of the invention in accordance with a manufacturing procedure. In FIGS. 3 and 4, the same structures as those shown in FIGS. 1 and 2 used in the explanation of the first example have the same reference numerals and description thereof will be omitted.

Figure 3A:
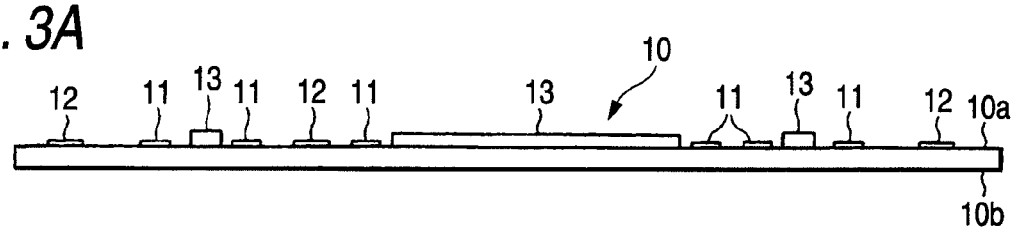
FIGS. 3A to 3E are views for explaining a method of manufacturing a chip integrated substrate according to a second example of the invention in accordance with a manufacturing procedure (No. 1)
Figure 3B:
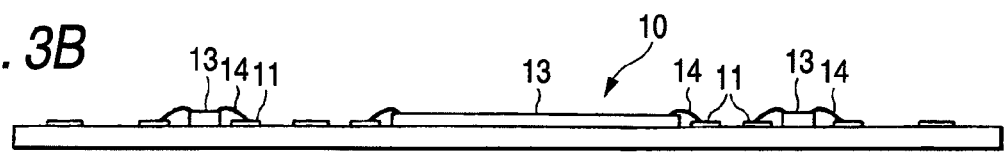

Steps shown in FIGS. 3A and 3B are identical to those shown in FIGS. 1A and 1B, and a chip component 13 is mounted on a first substrate 10 and the chip component 13 and a wire connecting pad 11 are connected to each other through a wire 14.

Figure 3C:
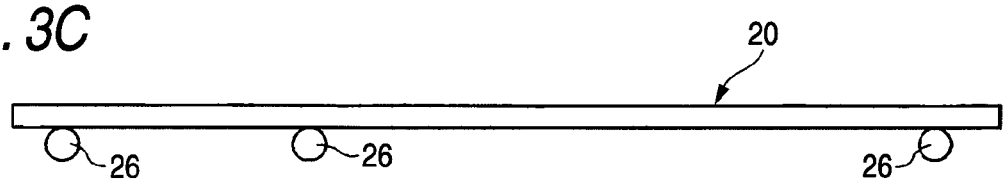

At a subsequent step shown in FIG. 3C, a copper ball 26 to be an electrode is bonded to a second substrate 20. Although the electrode 21 having the copper core 22 coated with the solder coat 23 is bonded to the second substrate 20 in the first example, the second example is characterized in that the copper ball 26 is bonded to the second substrate 20.

In order to bond the copper ball 26 to the second substrate 20, first of all, a flux non-containing conductive paste 30 (not shown) is applied to an electrode connecting pad formed on the second substrate 20. Subsequently, the copper ball 26 is pressure welded to the electrode connecting pad to which the flux non-containing conductive paste 30 is applied, and the copper ball 26 and the electrode connecting pad are bonded to each other.

By using the copper ball 26 which is not coated with the solder for the electrode connecting the first substrate 10 to the second substrate 20, thus, it is possible to bond the copper ball 26 to the second substrate 20 by using the flux non-containing conductive paste 30. Also when the copper ball 26 is to be bonded to the second substrate 20, consequently, a cleaning step can be made unnecessary. Thus, it is possible to simplify the process for manufacturing the chip integrated substrate 1B.

Also in the example, moreover, a lower surface side of the copper ball 26 is subjected to a polishing treatment and is thus flattened as in the first example so that a contact area with a connecting pad 12 of the first substrate 10 can be maintained to be large.

When the copper ball 26 is bonded to the second substrate 20 as described above, a processing of bonding the first substrate 10 to the second substrate 20 is then carried out. Steps to be carried out after the step of bonding the first substrate 10 to the second substrate 20 are almost identical to the steps described earlier with reference to FIGS. 2A to 2D. For this reason, the steps to be carried out after FIG. 2A will be simplified and described.

Figure 3D:
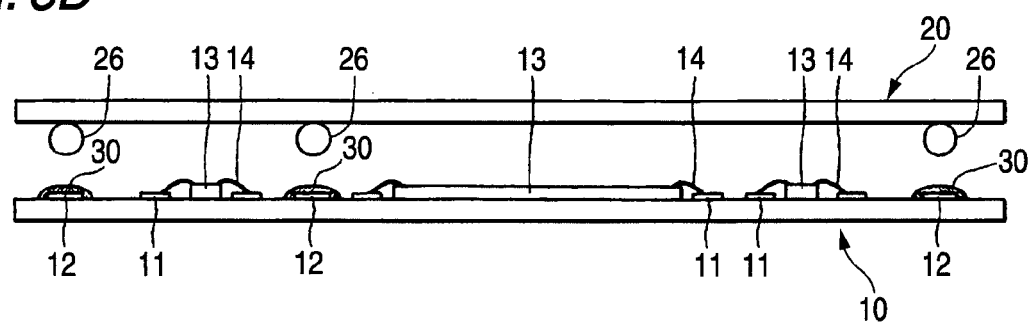

In order to bond the first substrate 10 to the second substrate 20, first of all, the flux non-containing conductive paste 30 is provided on the bump connecting pad 12 formed on the first substrate 10. As shown in FIG. 3D, subsequently, the first substrate 10 and the second substrate 20 are positioned in such a manner that the copper ball 26 and the bump connecting pad 12 are opposed to each other. Next, the first substrate 10 and the second substrate 30 are pressure welded and heated if necessary.

Figure 3E:
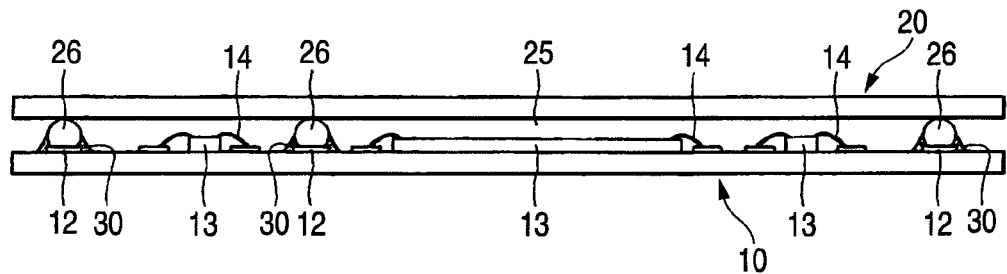

As shown in FIG. 3E, consequently, the copper ball 26 and the bump connecting pad 12 are bonded to each other through the flux non-containing conductive paste 30 so that the copper ball 26 and the bump connecting pad 12 are electrically connected to each other and are mechanically fixed.

In this case, also in the example, the bump connecting pad 12 and the copper ball 26 are bonded to each other through the flux non-containing conductive paste 30. Therefore, a soldering step can be made unnecessary. In the same manner as in the first example, accordingly, it is possible to simplify the process for manufacturing the chip integrated substrate 1B, and furthermore, to prevent a breakage or a short circuit from being generated on the wire 14. Consequently, it is possible to enhance a reliability of the chip integrated substrate 1B.

Figure 4A:
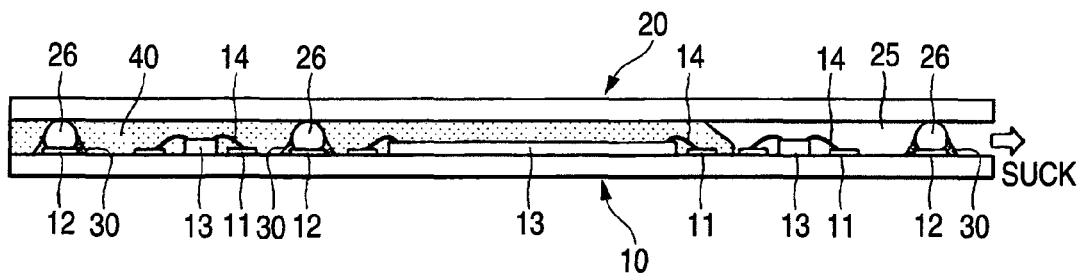
FIGS. 4A to 4D are views for explaining the method of manufacturing a chip integrated substrate according to the second example of the invention in accordance with the manufacturing procedure (No. 2).
Figure 4B:
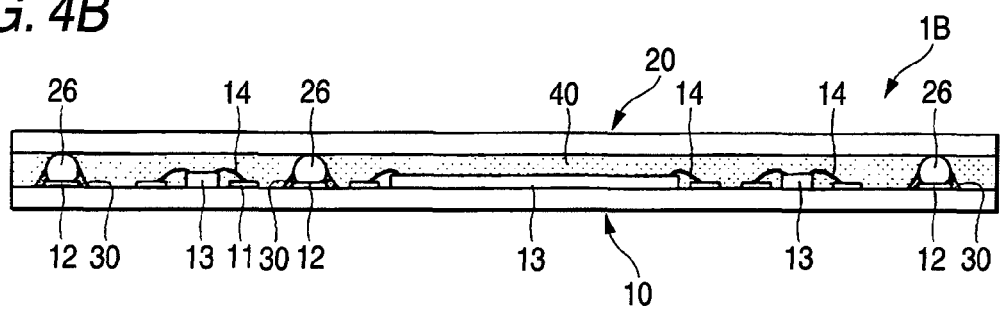
Figure 4C:
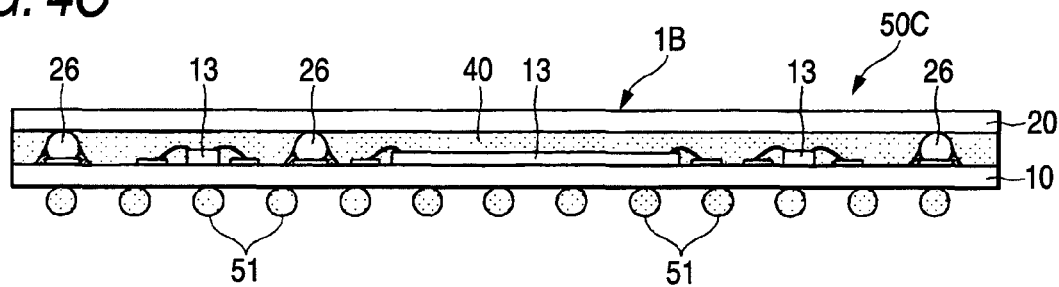
Figure 4D:
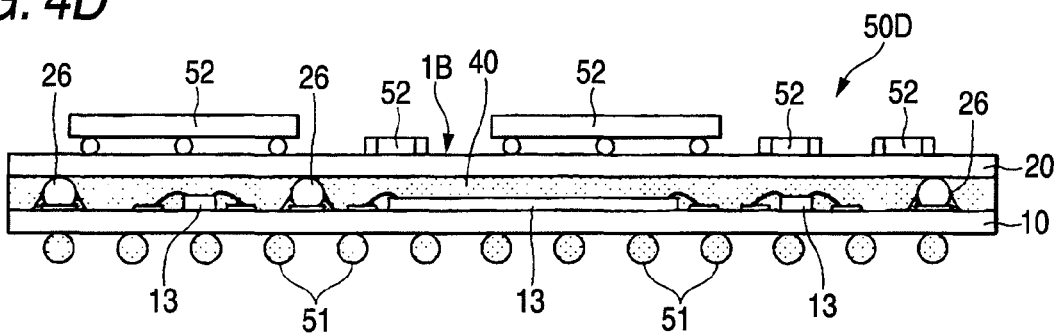

When the first substrate 10 and the second substrate 20 are bonded to each other as described above, a sealing resin 40 is then filled in a space portion 25 between the first substrate 10 and the second substrate 20 as shown in FIG. 4A, and the sealing resin 40 is cured so that the chip integrated substrate 1B shown in FIG. 4B is manufactured.

In the chip integrated substrate 1B manufactured as described above, a solder ball 51 functioning as an external connecting terminal is provided on a lower surface 10b of the first substrate 10. Consequently, the chip integrated substrate 1B can be used as an electronic device 50C shown in FIG. 4C. By mounting an electronic component 52 on an upper surface 20a of the second substrate 20, furthermore, it is possible to implement an electronic device 50D having a high density shown in FIG. 4D.

Although the preferred examples according to the invention are described above in detail, the invention is not restricted to the specific embodiment but various modifications and changes can be made without departing from the scope of the invention described in the claims.

What is claimed is:

1. A method of manufacturing a chip integrated substrate comprising the steps of:

connecting a chip component to a first substrate having a connecting pad formed thereon through wire bonding;

providing, on a second substrate, an electrode having a metal core coated with a solder film;

polishing a portion of the electrode which is to be bonded to the connecting pad to remove the solder film to expose the metal core;

bonding the connecting pad to the portion of the electrode from which the metal core is exposed by using a conductive bonding member that does not include a flux, and bonding the first substrate to the second substrate in such a manner that the chip component is provided therein and the exposed metal core is bonded to the connecting pad by the conductive bonding member; and filling a resin in a clearance portion between the first substrate and the second substrate.

2. The method of manufacturing a chip integrated substrate according to claim 1, wherein the conductive bonding member is a conductive paste that does not include the flux.

3. The method of manufacturing a chip integrated substrate according to claim 2, wherein the conductive paste uses copper or silver as a filler.

4. The method of manufacturing a chip integrated substrate according to claim 1, wherein a material of the metal core is copper.

5. The method of manufacturing a chip integrated substrate according to claim 1, wherein a height of the electrode is set to be greater than a height of a wire loop of the wire.

6. The method of manufacturing a chip integrated substrate according to claim 1, wherein the second substrate has a side opposite to that on which the electrode is disposed and which is configured to mount at least one other electronic component thereon.

7. A method of manufacturing a chip integrated substrate comprising the steps of:

connecting a chip component to a first substrate having a connecting pad formed thereon through wire bonding;

providing, on a second substrate, an electrode formed by a metallic material having an exposed metal core and protruded from a substrate surface;

bonding the connecting pad to the electrode by using a conductive bonding member that does not include a flux, and bonding the first substrate to the second substrate in such a manner that the chip component is provided therein and the exposed metal core is bonded to the connecting pad by the conductive bonding member; and filling a resin in a clearance portion between the first substrate and the second substrate, wherein the second substrate has a side opposite to that on which the electrode is disposed and which is configured to mount at least one other electronic component thereon.

8. The method of manufacturing a chip integrated substrate according to claim 7, wherein the conductive bonding member is a conductive paste that does not include the flux.

9. The method of manufacturing a chip integrated substrate according to claim 8, wherein the conductive paste uses copper or silver as a filler.

10. The method of manufacturing a chip integrated substrate according to claim 7, wherein the metallic material is copper.

11. The method of manufacturing a chip integrated substrate according to claim 7, wherein a height of the electrode is set to be greater than a height of a wire loop of the wire.

* * * * *